United States Patent [19]
Renner et al.
[11] 3,979,226
[45] Sept. 7, 1976

[54] THERMAL GENERATOR WITH PARALLEL CIRCUITS

[75] Inventors: Theodor Renner, Nurnberg-Eibach; Dieter Falkenberg; Gerhard Rittmayer, both of Erlangen; Georg Grubmüller, Nurnberg, all of Germany

[73] Assignee: Siemens Aktiengesellschaft, Munich, Germany

[22] Filed: Aug. 13, 1974

[21] Appl. No.: 496,997

[30] Foreign Application Priority Data

Aug. 30, 1973 Germany ............................ 2343840

[52] U.S. Cl. ................................ 136/208; 136/202; 136/224; 136/225

[51] Int. Cl.² ..................... H01L 35/10; G21H 1/10

[58] Field of Search ........... 136/202, 208, 225, 224, 136/212

[56] References Cited

UNITED STATES PATENTS

| | | | |
|---|---|---|---|
| 3,632,451 | 1/1972 | Abbott | 136/212 |
| 3,758,346 | 9/1973 | Falkenberg et al. | 136/208 |

*Primary Examiner*—Malcolm F. Hubler
*Assistant Examiner*—Richard E. Berger
*Attorney, Agent, or Firm*—Kenyon & Kenyon Reilly Carr & Chapin

[57] ABSTRACT

An improved thermal generator is described which includes a plurality of film thermocouples which are vapor-deposited on an insulating carrier material. The improvement resides in the fact that at least two rows of the thermocouples, arranged on the carrier with consecutive thermocouples alternating in polarity and serially connected to each other, are bridged together by a connecting layer which is vapor-deposited between two thermocouples in each row.

3 Claims, 2 Drawing Figures

THERMAL GENERATOR WITH PARALLEL CIRCUITS

BACKGROUND OF THE INVENTION

1. Field of the Invention

This invention pertains generally to thermal generators, and particularly, thermal generators employing thermocouples vapor-deposited on an electrically insulating carrier material.

2. Description of the Prior Art

Small, long-lasting power sources find ready application as electrical suppliers for heart pacers which are implanted in the human body. Electrochemical batteries previously used have a limited life of, at best, two years. After this time, the heart pacers must be replaced by a surgical operation.

Alternately, electrical power has been supplied through the use of thermal generators which use as their source of heat a radioactive radiator. These thermal microwatt generators should operate for many years with high efficiency and minimum space requirements.

German Auslegeschrift No. 2,002,197 describes the use of film thermocouples vapor-deposited on a ribbon-shaped electrical and tnermal insulating material which combines with a radioactive radiator to make up a suitable thermal generator. The carrier is designed as a spiral winding whose one end face is connected with the heat source and whose other end face is connected directly or indirectly with the generator housing — the latter serving as a cold heat exchanger for the generator.

The German Offenlegungsschrift No. 2,124,465 discloses a thermal generator which employs film thermocouples which are arranged on a suitable carrier adapted to be rolled-up to form a winding. Two such windings are used to form a hollow cylinder which are then positioned about the radioactive heat source. The winding is in film tape form and is only a few μm thick. The thickness of the thermocouple legs, which are vapor-deposited on the carrier, is of the same order of magnitude. Because of the thinness of the tape, care must be taken that the thermocouple legs are not damaged when the winding is formed. If a break occurs in any one of the numerous thermocouple legs, the entire series circuit of the thermocouples becomes inoperative. This is a continuing problem even after the winding is completed since the mechanical strength is relatively low. Damage to a given leg can also occur during the operation of the thermal generator due either to excessive mechanical stresses, and more likely, due to excessive thermal stresses.

It is therefore a primary object of this invention to increase the handling and operational reliability of known thermal generators employing film thermocouples.

SUMMARY OF THE INVENTION

An improved thermal generator is described which includes a plurality of film thermocouples which are vapor-deposited on an insulating carrier material. The improvement resides in the fact that at least two rows of the thermocouples arranged on the carrier with consecutive thermocouples alternating in polarity and serially connected to each other, bridged together by a connecting layer which is vapor-deposited between two thermocouples in each row.

With the above arrangement, the two series circuits of thermocouples are connected in parallel and, further, two thermocouples of the two series circuits are always connected in parallel. The arrangement has the advantage that the entire generator current can flow via the parallel-connected thermocouple if the other thermocouple is destroyed. The operation of the thermal generator is therefore not disturbed by the failure of one or even several thermocouples, as long as two parallel-connected thermocouples are not disturbed.

The electrically bridging means can be designed so that their length, i.e. the dimension between the pairs of consecutive thermocouples, h, is substantially greater than their length transverse to that direction. With that arrangement, an approximate cylindrical container holding the radioactive heat source can be disposed in the center of the cylindrical winding and enclosed thereby. In this arrangement, the heat flow of the radioactive heat source can be utilized by thermocouples on two opposite sides of the thermal generator housing, although they are arranged on a single winding.

The beginnings and/or ends of the two rows of thermocouples can be connected by suitable lead connections which may also be vapor-deposited on the insulating carrier.

BRIEF DESCRIPTION OF THE DRAWINGS

Reference is now made to the accompanying drawings for a better understanding of the nature and objects of the invention. The drawings illustrate the best mode presently contemplated for carrying out the objects of the invention and its principles, and they are not to be construed as restrictions or limitations on its scope. In the drawings.

DESCRIPTION OF THE PREFERRED EMBODIMENT

Figure 1:
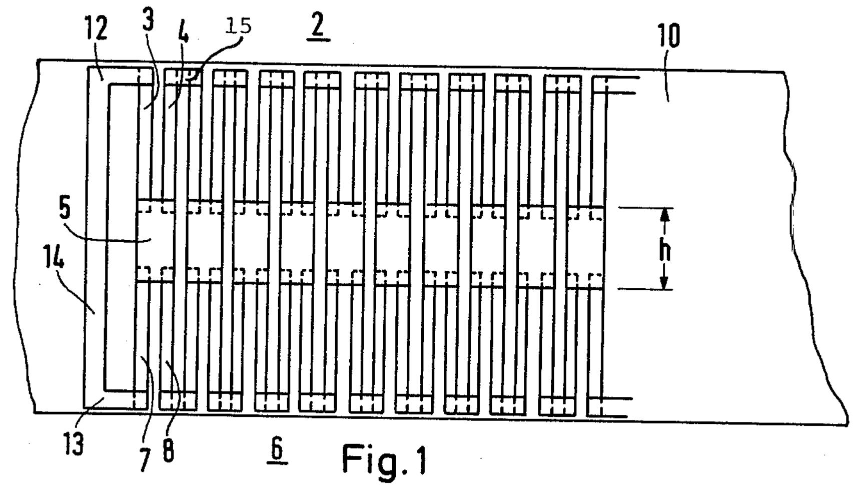
FIG. 1 is a plan view of the carrier material containing the thermocouple legs in accordance with the invention.

Referring to FIG. 1, there is shown two series circuits of thermocouples, 2 and 6, which are arranged on a common carrier 10 made from an electrically insulating and poor thermoconducting material which, preferably, would be a film of polyimide. The individual thermocouple legs, shown typically as 3, 4, 7, and 8, preferably, are made of zinc antimonide which is first vapor-deposited on the carrier material 10 and then annealed according to well known principles. The thermocouples are connected in a serial fashion at the top, as viewed in FIG. 1, by connecting means shown typically as 15. The bottoms of the thermocouple legs are connected in a serial fashion by one end of bridging means 5. Likewise, the top ends of thermocouple legs 7 and 8 are connected by the opposite end of bridging means 5. Two consecutive legs of each thermocouple row, such as 3 and 4 in the top row or 7 and 8 in the bottom row, are deposited on the carrier material such that they have opposite conductivity relative to each other. The result is two serially connected rows of thermocouples which have corresponding thermocouple legs bridged together. This arrangement has the advantage that the entire generator current can flow via the parallel-connected thermocouple if the other thermocouple is destroyed.

To connect the entire series circuits in parallel, the bridges 12 and 13 at the beginning of each of these series circuits may be provided with a common lead connection 14. This, too, may be vapor-deposited on the carrier 10. A suitable electrical conductor can be connected to the lead 14 for bringing that end of the thermocouple chain to the remainder of the electronic circuitry. The opposite end of the two series circuits, not shown in the figure, can be connected in a similar manner so as to form the second terminal of the voltage source. In a typical application that end would be connected to the housing (not shown) of the thermal generator.

Figure 2:
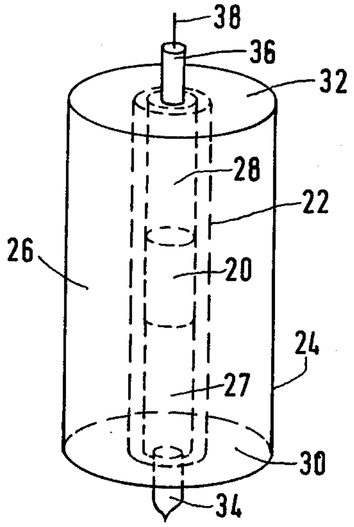
FIG. 2 shows in perspective, schematic form the arrangement of the thermocouple carrier tape in a winding positioned about the heat source.

FIG. 2 shows in schematic form how the ribbon-shaped carrier 10 with the series thermocouple circuits deposited thereon can be employed as a practical thermal generator. The carrier is wound to form a spiral in a known manner. In the wound condition, it forms a hollow cylinder of predetermined minimum diameter. A substantially cylindrical container 20 into which is placed the radioactive heat source, is positioned within the cylindrical cavity defined by the winding 22. The diameter of the container 20 is substantially equal to the diameter of the hollow cylinder. Referring to FIG. 1, the length of the bridging means 5, *h*, is preferably chosen so that it is approximately equal to the axial length of cylinder 20. It is preferable if the first turn of the winding, i.e. that turn closest to the cylinder 20, does not include any thermocouple legs.

In order to optimize the efficiency of the thermal generator, it is important that the system shown in FIG. 2 employs proper thermal insulation. For example, the cylinder-winding combination, 20-22, is positioned within the thermal generator housing 24. A suitable heat-retarding material would be interposed between the outside diameter of the winding 22 and the housing wall so as to inhibit heat flow between the winding and the periphery of the housing. Similarly, the spaces above and below the cylinder 20, 28 and 27, preferably are filled with a suitable heat-retarding material so that heat flow from the container 20 to the ends 30 and 32 of the housing 24 is only possible, practically speaking, through the winding 22 and the thermocouples positioned thereon.

A suitable heat-retarding material might be comprised of a foil which is made from a plastic material of low heat conductivity but with high temperature stability and which can be provided on one side thereof with a thin metal layer such as gold, which can be vapor-deposited on the plastic substrate. The foil can be tamped into the spaces 27 and 28 and is thin enough to be formed in a winding, similar to winding 22, the individual layers of which surround the thermocouple winding 22.

The thermal efficiency of the generator can be further increased by evacuating the housing 24, after the thermocouple unit and the heat source are inserted therein. For this purpose, the bottom lid of the generator, 30, includes an evacuation stem 34. The latter would be made from a suitably ductile material, e.g. copper. After the interior of the housing 24 is evacuated, the stem 34 is squeezed off and soldered in a known manner to thereby provide an hermetic seal for the housing. In certain situations it is advantageous to position in the stem 34 or in a space within the housing close to the stem 34 a getter which, preferably consisting of a sintered mixture of zirconium and carbon or other suitable materials which absorb gasses within the housing, are liberated during the evacuation operation.

The generator housing is also provided with a vacuumtight feedthrough 36 which enables the electrical connection 38 to be brought out of the generator. The feedthrough 36 may be positioned at either end of the generator. The terminal lead 38 is connected within the housing to lead 14 and outside the housing to the electronics of the heart pacer. Although the embodiment depicted in FIG. 2 suggests that the cylindrical container 20 for the radio isotope source is cylindrical in shape it is to be appreciated, that the housing may have different shapes. For example, it might comprise two essentially hemispherical container halves or truncated-cone container halves, between which a cylindrical container part is provided. The latter makes the necessary close contact with the winding 22 to thereby provide good heat transfer to the thermocouples. This is the important criteria, viz. that the heat source container be secured within the winding and that good heat transfer from the container to the winding and thus to the housing be assured.

In certain situations, even a spherical housing can be provided as a container for the heat source. In that case either a suitable adhesive must be used between the container and the winding 22 or, preferably, the spherical container is provided with at least one cylindrical flange whose outer edge may be cemented to the winding 22.

Alternately, the container 20 can be surrounded by an annular or cylindrical heat distributor manufactured from a highly heat-conductive material such as copper. The design can be configured such that the heat distributor transmits the heat produced in the heat source to the bridges 5 of the two rows of thermocouples. In this case, the container 20 could assume almost any desired shape. Again, it is only important that a substantial amount of the heat generated by the source is removed from the container 20 to the housing 24 via the winding 22.

Other variations in the particular construction of the film and the thermal generator itself are and would be obvious to those skilled in the art. The above described embodiments are not to be construed as limitations on the breadth of the invention, which is defined by the scope of the claims attached hereto.

What is claimed is:

1. A thermal generator including a plurality of film thermocouples deposited on an insulating carrier in the form of a winding which comprises:

a. at least two rows of said thermocouples each arranged on said carrier such that individual thermocouples alternate in polarity along the length of each row and are serially connected to the others in said row; and b. means for electrically bridging two consecutive thermocouples in one row to two corresponding consecutive thermocouples in a second row, said winding being formed into a cylindrical shape for placement about a correspondingly shaped "heat source", and the length of said bridging means, h, between the pairs of consecutive thermocouples being approximately equal to the axial length of said cylindrical shape.

2. The thermal generator of claim 1 further comprising electrical connecting means deposited on said carrier between the starting points of each row.

3. The thermal generator of claim 1 further comprising electrical connecting means deposited on said carrier between the end points of each row.

* * * * *